United States Patent
Yang et al.

(10) Patent No.: US 9,493,126 B2
(45) Date of Patent: Nov. 15, 2016

(54) ELECTRONIC CONTROL APPARATUS FOR VEHICLE USING COUPLING MEMBER AND METHOD FOR MANUFACTURING THE SAME

(71) Applicant: Hyundai Autron Co., Ltd., Seongnam-si (KR)

(72) Inventors: Sun Jae Yang, Uiwang-si (KR); Chang Guen Shin, Yongin-si (KR); Ju Hyung Lee, Suwon-si (KR); Jun Ho Lee, Seoul (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 121 days.

(21) Appl. No.: 14/565,223

(22) Filed: Dec. 9, 2014

(65) Prior Publication Data
US 2016/0095234 A1   Mar. 31, 2016

(30) Foreign Application Priority Data
Sep. 30, 2014 (KR) .......................... 10-2014-0131922

(51) Int. Cl.
  *H05K 5/00* (2006.01)
  *B60R 16/023* (2006.01)
(52) U.S. Cl.
  CPC ........... *B60R 16/0239* (2013.01); *H05K 5/006* (2013.01); *H05K 5/0039* (2013.01)
(58) Field of Classification Search
  None
  See application file for complete search history.

(56) References Cited

U.S. PATENT DOCUMENTS

| | | | | |
|---|---|---|---|---|
| 3,561,631 A | * | 2/1971 | Hatfield | B65D 41/42 215/255 |
| 5,272,593 A | * | 12/1993 | Jakob | H05K 7/20854 257/713 |
| 5,392,197 A | * | 2/1995 | Cuntz | H05K 5/0047 174/377 |
| 5,577,768 A | * | 11/1996 | Taguchi | B60R 21/2035 280/728.2 |
| 6,094,349 A | * | 7/2000 | Fassel | H05K 3/284 165/80.2 |

(Continued)

*Primary Examiner* — Courtney Smith
*Assistant Examiner* — Rashen E Morrison
(74) *Attorney, Agent, or Firm* — Mayer Brown LLP; Hyunho Park

(57) ABSTRACT

Disclosed is an electronic control apparatus comprises: a PCB configured to electrically control each part of the vehicle and have at least one through-hole in a side; a connector cover includes a connector part electrically connected and coupled with the PCB and a coupling part; a housing configured of a one-piece slot type to receive the PCB inserted in a slide form and provided with at least one housing-hole penetrating through the through-hole of the inserted PCB; and a hollow rivet configured to penetratively fix the PCB to the housing through the through-hole of the PCB and the housing-hole of the housing, wherein the hollow rivet is penetratively inserted into the housing-hole through which the PCB is inserted into the housing and then one end surface of the hollow rivet is physically deformed, such that the PCB adheres to an inside of the housing.

13 Claims, 12 Drawing Sheets

(56) References Cited

U.S. PATENT DOCUMENTS

| | | | | |
|---|---|---|---|---|
| 6,628,523 B2* | 9/2003 | Kobayashi | H05K 5/0047 | 361/736 |
| 6,717,051 B2* | 4/2004 | Kobayashi | B60R 16/0239 | 174/535 |
| 6,881,077 B2* | 4/2005 | Throum | H05K 5/0052 | 174/16.3 |
| 7,140,885 B2* | 11/2006 | Kitamura | H05K 5/0039 | 361/752 |
| 7,190,589 B2* | 3/2007 | Caines | H05K 5/061 | 174/16.1 |
| 7,413,463 B2* | 8/2008 | Matsuo | H05K 5/0039 | 439/377 |
| 7,417,868 B2* | 8/2008 | Morisada | H05K 7/1405 | 361/741 |
| 7,699,622 B2* | 4/2010 | Sakamoto | H01R 13/629 | 439/76.1 |
| 7,813,134 B2* | 10/2010 | Katsuro | H05K 7/20454 | 165/104.33 |
| 8,115,289 B2* | 2/2012 | Kishibata | H05K 1/148 | 257/415 |
| 8,184,438 B2* | 5/2012 | Kaneko | H05K 7/20854 | 165/80.2 |
| 8,408,945 B2* | 4/2013 | Schober | H05K 5/0039 | 439/660 |
| 8,942,001 B2* | 1/2015 | Kawai | H05K 5/0052 | 174/50.5 |
| 9,093,776 B2* | 7/2015 | Yamanaka | H05K 5/0069 | |
| 9,293,870 B1* | 3/2016 | Koczwara | H01R 12/724 | |
| 9,313,936 B2* | 4/2016 | Seok | H05K 13/0023 | |
| 2004/0212974 A1* | 10/2004 | Ice | G02B 6/4277 | 361/801 |
| 2008/0074840 A1* | 3/2008 | Suzuki | H05K 5/0047 | 361/679.46 |
| 2009/0068862 A1* | 3/2009 | Honda | H05K 5/0052 | 439/78 |
| 2009/0103267 A1* | 4/2009 | Wieland | H05K 7/20409 | 361/707 |
| 2011/0013370 A1* | 1/2011 | Oota | H01L 23/42 | 361/752 |
| 2011/0228498 A1* | 9/2011 | Kawai | H05K 7/20854 | 361/752 |
| 2012/0190252 A1* | 7/2012 | Pavlinsky | H01M 10/425 | 439/775 |
| 2013/0058044 A1* | 3/2013 | Watanabe | H05K 5/006 | 361/714 |
| 2013/0250521 A1* | 9/2013 | Kawai | H05K 7/20854 | 361/714 |
| 2013/0286606 A1* | 10/2013 | Watanabe | H05K 7/1417 | 361/752 |
| 2014/0065877 A1* | 3/2014 | Ohhashi | H05K 5/0052 | 439/519 |
| 2014/0085839 A1* | 3/2014 | Nakano | H05K 5/0052 | 361/752 |
| 2014/0334115 A1* | 11/2014 | Yang | H05K 5/06 | 361/752 |
| 2014/0334116 A1* | 11/2014 | Lee | H05K 5/0052 | 361/752 |
| 2014/0362533 A1* | 12/2014 | Shin | H05K 7/2039 | 361/707 |
| 2015/0022976 A1* | 1/2015 | Ott | H01L 23/057 | 361/736 |
| 2015/0146347 A1* | 5/2015 | Lee | H01R 13/5202 | 361/679.01 |
| 2015/0250072 A1* | 9/2015 | Ichikawa | H05K 5/063 | 439/587 |

\* cited by examiner

ELECTRONIC CONTROL APPARATUS FOR VEHICLE USING COUPLING MEMBER AND METHOD FOR MANUFACTURING THE SAME

CROSS-REFERENCE TO RELATED APPLICATIONS

This application claims priority to and the benefit of Korean Patent Application No. 10-2014-0131922 filed in the Korean Intellectual Property Office on Sep. 30, 2014, the entire contents of which are incorporated herein by reference.

TECHNICAL FIELD

The present disclosure relates to an electronic control apparatus for a vehicle capable of fixing an electronic control substrate within a housing using a coupling member and a method for manufacturing the same.

BACKGROUND ART

Generally, an electronic control apparatus such as an electronic control unit (ECU) electronically controlling various apparatuses is equipped in a vehicle. The electronic control apparatus receives information from sensors or switches which are equipped in each part of a vehicle and processes the received information to serve to promote improvement in riding comfort and safety of the vehicle or perform various electronic controls for providing various conveniences to a driver and passengers.

For example, the electronic control apparatus such as the ECU which controls a state of an engine, an automatic transmission, an anti-lock brake system, and the like of the vehicle using a computer serves to control all the parts of the vehicle, such as a driving system, a braking system, and a steering system, as well as controlling the automatic transmission, with the development of performance of the vehicle and the computer.

The electronic control apparatus such as the ECU is configured to include a case configured of an upper cover and a lower base, a printed circuit board (PCB) received in the case, a connector coupled with a front end of the PCB for external socket connection.

The case has a structure in which the cover and the base are assembled together while covering the PCB, in particular, the connector interposed between the cover and the base at the time of assembling the cover and the base has a sealing structure with the cover side and the base side.

The electronic control apparatus has a high integrated control circuit means and thus requires a predetermined sealing structure to be able to prevent external moisture or foreign objects from being introduced thereinto. The electronic control apparatus mainly adopts the sealing structure for protecting the PCB, and the like therein in a scheme of assembling the cover and the base together with the connector, in the state in which a sealing agent is inserted into the coupling portion among the cover, the base, and the connector.

Meanwhile, the electronic control apparatus may be assembled by being inserted into a housing in a slide form. In this case, in the electronic control apparatus configured of a one-piece housing form, when the PCB is assembled by being slid inside the housing, the PCB is not fixed within the housing.

In particular, when a one-piece slot type housing is made of a metal material, the PCB inserted into the housing is not fixed but may vibrate or move as much as a gap of the housing. The electronic control apparatus is equipped in the vehicle and therefore may severely vibrate. Therefore, the electronic control apparatus configured of the one-piece slot type housing may be damaged due to the vibration of the vehicle.

SUMMARY OF THE INVENTION

The present disclosure has been made in an effort to provide an electronic control apparatus for a vehicle and a method for manufacturing the same capable of fixing an electronic control substrate within a one-piece slot type housing using a coupling member together with the housing.

However, an object of the present disclosure is not limited to the foregoing matters and other objects of the present disclosure which are not mentioned may be clearly understood to those skilled in the art from the following description.

An exemplary embodiment of the present disclosure provides an electronic control apparatus for a vehicle, comprising: a printed circuit board (PCB) configured to electrically control each part of the vehicle and have at least one through-hole in a side; a connector cover includes a connector part electrically connected and coupled with the PCB and a coupling part; a housing configured of a one-piece slot type to receive the PCB inserted in a slide form and provided with at least one housing-hole penetrating through the through-hole of the inserted PCB; and a hollow rivet configured to penetratively fix the PCB to the housing through the through-hole of the PCB and the housing-hole of the housing, wherein the hollow rivet is penetratively inserted into the housing-hole through which the PCB is inserted into the housing and then one end surface of the hollow rivet is physically deformed, such that the PCB adheres to an inside of the housing.

Both ends of the hollow rivet are inserted with O-rings and a gap of a coupled portion between the housing and the hollow rivet is sealed by the O-rings.

After the hollow rivet is penetratively inserted into the housing-hole, one end surface of the hollow rivet protruding to an outside of the housing is inserted with the O-ring and one end surface of the protruding hollow rivet is physically deformed so as to generate a pressing force to the PCB, such that the PCB adheres to the inside of the housing.

The O-ring is a circular ring made of a rubber or synthetic resin material.

The O-ring is made of a liquid-phase silicon material having high viscosity.

The housing-hole is penetratively formed so that a hole formed on a top side of the housing has a cross sectional area wider than that of a hole formed on a bottom side thereof, and the hollow rivet penetrating through the housing-hole has an upper width which is wider than a lower width so as to correspond to the housing-hole.

A cross sectional area of the through-hole formed on the PCB is smaller than that of the housing-hole formed on the top side of the housing and is larger than that of the housing-hole formed on the bottom side of the housing, and the hollow rivet maintains the same width so as to penetrate through the housing-hole formed on the top side of the housing up to a predetermined height from the top side of the housing-hole to a position near the bottom side thereof and has a narrow width so as to penetrate through the through-hole formed on the PCB and the housing-hole formed on the bottom side of the housing.

The coupling part of the connector cover is provided with a protrusion and a corresponding surface of the housing contacting the coupling part is provided with a groove to fasten the protrusion of the coupling part with the groove of the housing when the connector cover is coupled with the housing.

Another exemplary embodiments of the present disclosure provides an electronic control apparatus for a vehicle, comprising: a printed circuit board (PCB) electrically configured to control each part of the vehicle; a connector cover includes a connector part electrically connected and coupled with the PCB and a coupling part; a housing configured of a one-piece slot type to receive the PCB inserted in a slide form and having at least one housing-hole on surfaces of both sides; and a solid rivet configured to fix the PCB to the housing through the housing-hole of the housing, wherein after the solid rivet is inserted into the housing-hole, a physical pressure is applied from the top side of the solid rivet for deformation of a shape of the solid rivet, such that the PCB adheres to the inside of the housing through the solid rivet.

The PCB includes a protrusion which protrudes toward the housing-hole and has a predetermined height, and the solid rivet has a groove into which the protrusion of the PCB is inserted.

The solid rivet includes a head portion having a cross sectional area larger than the housing-hole and a body portion having a width which penetrates through the housing-hole and a length which is larger than a height formed between the PCB and the housing, and a material of the head portion is rigid compare to the body portion, an inside of the body portion is provided with the groove to couple the solid rivet with the protrusion of the PCB through the housing-hole, and after the solid rivet is inserted into the housing-hole, a physical pressure is applied from the head portion protruding to the outside of the housing for deformation of a shape of the body portion of the solid rivet, such that the PCB adheres to the inside of the housing.

Yet another exemplary embodiments of the present disclosure provides a method for manufacturing an electronic control apparatus for a vehicle of a one-piece slot type which receives a printed circuit board (PCB), a connector, and a housing and has the PCB and the housing provided with a penetration type housing-hole, the method comprising: coupling the PCB electrically controlling each part of the vehicle with a connector; inserting the PCB into the housing in a slide form; penetratively inserting a hollow rivet having one end surface inserted with an O-ring into the housing-hole of the housing into which the PCB is inserted; inserting and coupling the O-ring into a longitudinal cross section of the hollow rivet protruding to an outside of the housing-hole; and fixing the PCB to the inside of the housing by physically deforming a longitudinal cross section of the hollow rivet into which the O-ring is inserted.

The O-ring inserted into the hollow rivet is a circular ring made of a rubber or synthetic resin material and a gap of a coupled portion between the housing and the hollow rivet is sealed by the O-ring.

The O-ring is made of a liquid-phase silicon material having high viscosity and a gap of a coupled portion between the housing and the hollow rivet is sealed by the O-ring.

The housing-hole is penetratively formed so that a housing-hole formed on a top side of the housing has a cross sectional area wider than that of a housing-hole formed on a bottom side of the housing, and the hollow rivet penetrating through the housing-hole has an upper width which is wider than a lower width so as to correspond to the housing-hole.

A cross sectional area of the housing-hole formed on the PCB is smaller than that of the housing-hole formed on the top side of the housing and is larger than that of the hole formed on the bottom side of the housing, and the hollow rivet maintains the same width so as to penetrate through the hole formed on the top side of the housing up to a height from the top side of the housing-hole to a position near the bottom side thereof and has a narrow width so as to penetrate through the housing-hole formed on the PCB and the housing-hole formed on the bottom side of the housing.

According to at least some of the exemplary embodiments of the present disclosure, it is possible to fix the PCB within the one-piece slot type housing by a hollow rivet or a solid rivet, together with the housing.

According to at least some of the exemplary embodiments of the present disclosure, it is possible to fix the PCB to the housing by the mechanical coupling member such as the hollow rivet or the solid rivet without fixing the PCB using the sealing agent.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
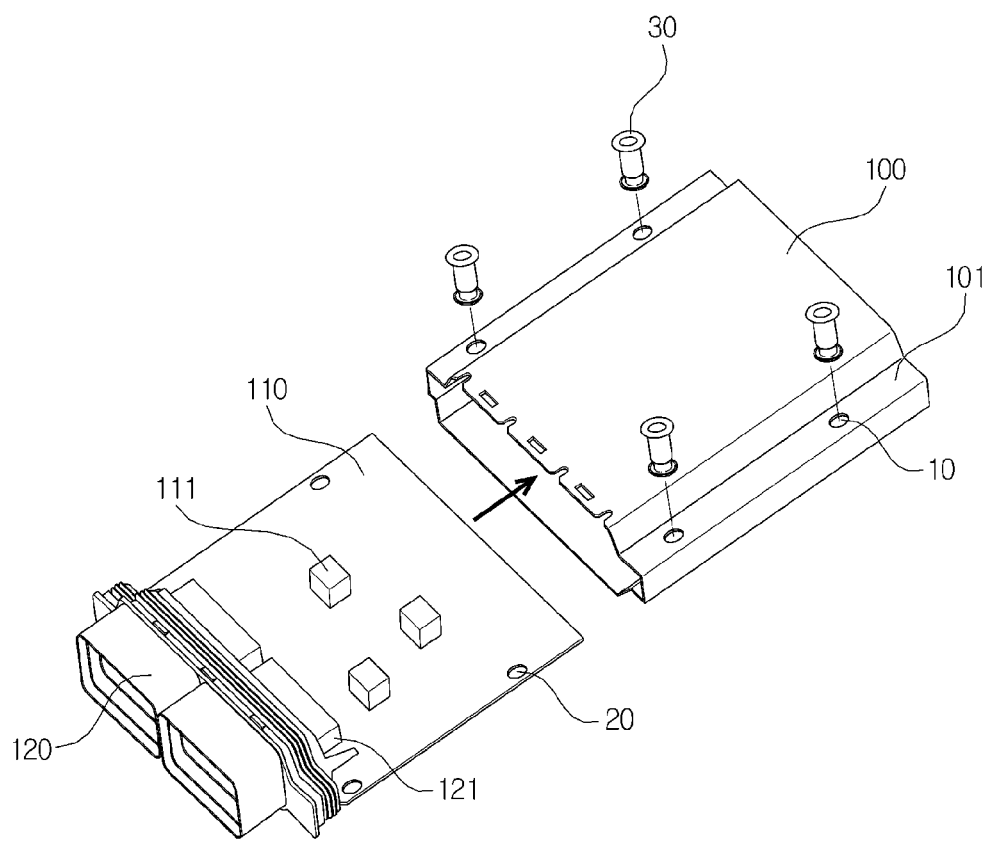
FIG. 1 is a coupling perspective view of an electronic control apparatus for a vehicle using a hollow rivet according to an exemplary embodiment of the present disclosure.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particular intended application and use environment.

DETAILED DESCRIPTION

Hereinafter, exemplary embodiments of the present specification will be described in detail with reference to the accompanying drawings.

In describing exemplary embodiments of the present disclosure, a description of technical contents which are known to the art to which the present specification belongs and are not directly connected with the present disclosure will not be described. This is to more clearly transmit a gist of the present specification by omitting an unnecessary description.

For the same reason, some components are exaggerated, omitted, or schematically illustrated in the accompanying drawings. Further, the size of each component does not exactly reflect its real size. In each drawing, the same or corresponding components are denoted by the same reference numerals.

According to an exemplary embodiment of the present disclosure, an electronic control apparatus receives an electronic control substrate electrically controlling each part of a vehicle, for example, an integrated control circuit means such as a PCB, and the like. The electronic control apparatus includes a fixed structure capable of preventing failure of the integrated control circuit means, such as a PCB, due to external vibration. Further, the electronic control apparatus may have a heat radiation structure which emits heat generated from a heat radiation element positioned on the electronic control substrate into the air and a housing structure for preventing external moisture or foreign objects from being introduced. The electronic control apparatus has a can type one-piece housing form which has the electronic control substrate included therein.

Hereinafter, the electronic control apparatus for a vehicle using a coupling member according to the exemplary embodiment of the present disclosure will be described in detail with reference to the accompanying drawings.

FIG. 1 is a coupling perspective view of an electronic control apparatus for a vehicle using a hollow rivet according to an exemplary embodiment of the present disclosure.

As illustrated in FIG. 1, the electronic control apparatus for a vehicle according to the exemplary embodiment of the present disclosure receives a printed circuit board (PCB) 110, a connector cover 120, and a housing 100. Here, after the PCB 110 is coupled, the coupling member fixes the housing 100 and the PCB 110.

The connector cover 120 with which the PCB 110 is coupled is inserted into the housing 100 in a slide form. That is, the housing 100 and the connector cover 120 are coupled with each other in the slide form. After the coupling between the housing 100 and the connector cover 120 is completed, the PCB 110 is inserted into the housing 100 in the slide form. The housing 100 may also include a slide guide 101 for the slot guide when the slot type PCB 110 is inserted into the housing 100 in the slide form.

Here, the housing 100 has a one-piece slot type and receives the PCB 110 which is inserted in the slide form. The housing 100 is provided with a housing-hole which penetrates through the inserted PCB 110.

The connector cover 120 includes a connector part 121 coupled with the PCB 110.

Describing the connector cover 120, a coupling part and the connector part 121 may be a separated type or an integrated type for waterproofing. The coupling part is coupled with the housing 100. The connector part 121 is coupled with the PCB 110 and is electrically connected thereto. The connector part 121 includes a connector pin and is electrically connected to the PCB 110 through the connector pin. The connector pin may include a plurality of inner pins for connecting with the PCB 110 therein and a plurality of outer pins for connecting with the outside. The connector part 121 may be physically inserted into the PCB 110 and may be electrically connected to the PCB 110 by the inner pin. The connector part 121 may have a structure in which a front portion and a rear portion thereof exposed to the outside have an integrated type.

One surface of the PCB 110 may include an electronic control element 111. That is, the PCB 110 may have a top side or a bottom side provided with the electronic control element 111 (for example, electric element or heat radiating element). An outside of the connector cover 120 is connected to the connector part 121 and an inside of the housing 100 is connected to the PCB 110. The housing 100 may have a heat radiating structure and may emit the heat generated from the electronic control element 111 to the outside through the housing 100.

The coupling member may fix the PCB 110 to the housing 100 through the housing-hole 10 which penetrates through the PCB 110 and the housing 100 and according to the exemplary embodiment of the present disclosure, as the coupling member, a hollow rivet 30 may be used.

The hollow rivet 30 according to the present specification will be described in detail with reference to FIGS. 2A and 2B.

Figure 2A:
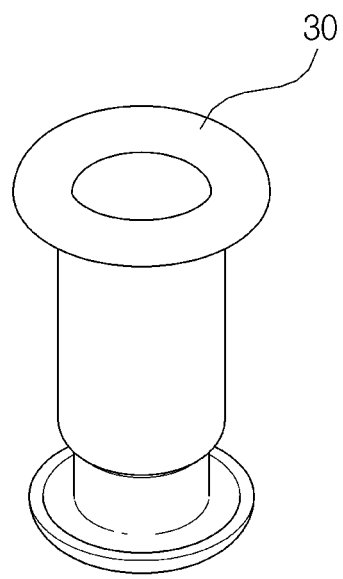
FIGS. 2A and 2B are a perspective view and a cross-sectional view illustrating a structure of the hollow rivet according to the exemplary embodiment of the present disclosure.
Figure 2B:
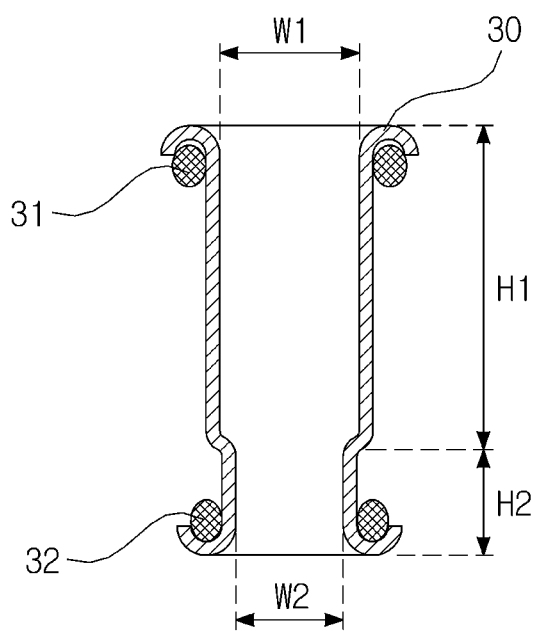

FIGS. 2A and 2B are diagrams illustrating a structure of the hollow rivet according to the present specification, in which FIG. 2A is a perspective view of the hollow rivet and FIG. 2B is a cross-sectional view of the hollow rivet.

The hollow rivet 30 has a cylindrical shape of which the center is hollow and is formed so that an upper width W1 is wider than a lower width W2.

The hollow rivet 30 has the same width W1 so as to penetrate through the hole formed on a top side of the housing and a through-hole of the PCB 110 up to a height H1 from the top side of the housing-hole to a position near a bottom side thereof and then has a narrow width W2 so as to penetrate through a hole formed on the bottom side of the housing from a position near the bottom side of the housing to a longitudinal cross section H2.

An end of an upper portion of the hollow rivet 30 is bent to be enclosed outward by riveting and the hollow rivet 30 has an O-ring 31 inserted thereinto.

The hollow rivet 30 is penetratively inserted into the housing-hole 10 and then an O-ring 32 is also inserted into an end of the lower portion of the hollow rivet 30 protruding to the outside housing.

The O-rings 31 and 32 are a circular ring of a rubber or synthetic resin material and a gap of a coupled portion between the housing 100 and the hollow rivet 30 may be sealed by the insertion of the O-ring 31 and 32.

Next, the end surface of the lower portion of the hollow rivet 30 protruding to the lower portion of the housing 100 is physically deformed by the riveting, and the like so as to generate a pressing force to the PCB 110, and thus the end thereof is bent to be enclosed outwardly. In this case, the bent end surface may have a shape to enclose the previously inserted O-ring 32.

FIGS. 3A to 3D are diagrams illustrating a hollow rivet fastening process according to a first exemplary embodiment of the present disclosure.

First, as illustrated in FIG. 1, both sides of the housing 100 are provided with at least one housing-hole 10. As illustrated, two housing-holes 10 may be formed at each of the both sides, respectively, and thus the number of housing-holes 10 may be four in total, but the present disclosure is not limited to the number of housing-holes 10 illustrated in FIG. 1 is not limited, and therefore the number of holes may be four or less or four or more.

In the PCB 110, a through-hole 20 is formed at a position corresponding to the housing-hole 10.

When the PCB 110 is inserted into the housing 100 in a slide form, the housing-hole 10 and the through-hole 20 are disposed to be overlapped with each other.

Figure 3A:
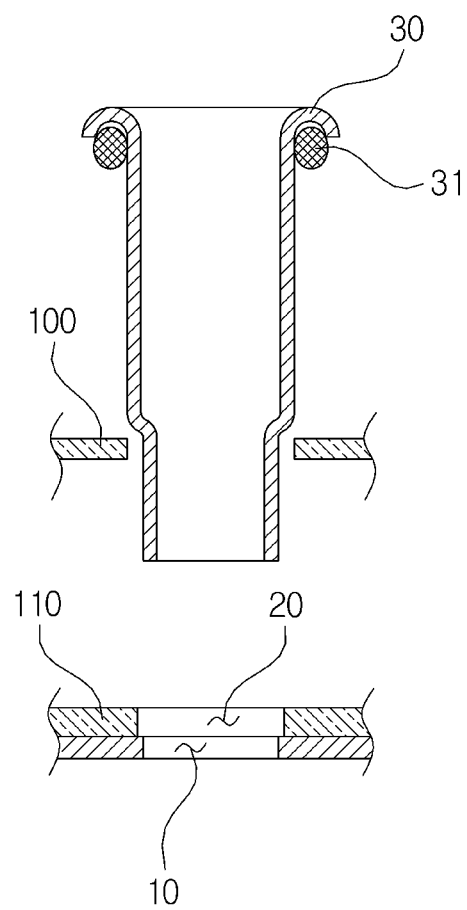
FIGS. 3A to 3D are diagrams illustrating a hollow rivet fastening process according to a first exemplary embodiment of the present disclosure.
Figure 3B:
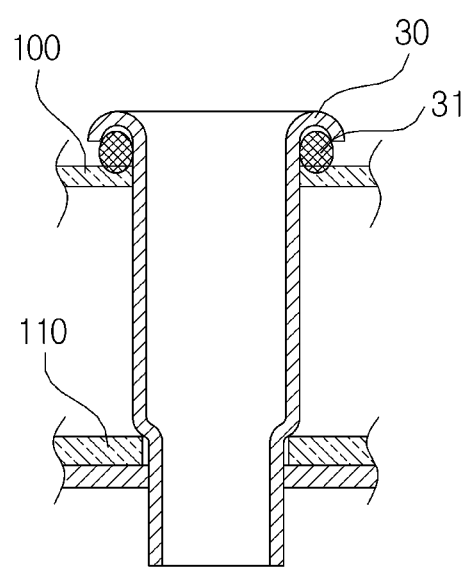

As illustrated in FIG. 3A, the end of the upper portion of the hollow rivet 30 is bent to be enclosed outwardly by the riveting and the inside thereof is inserted with the O-ring 31 and the end of the lower portion of the hollow rivet 30 maintains a flat form without a physical deformation so as to penetrate through the housing-hole 10. As described above, when the hollow rivet 30 is inserted from the hole of the top side of the housing 100, as illustrated in FIG. 3B, the riveted end of the upper portion of the hollow rivet 30 extends over the hole of the top side of the housing. In this case, the gap of the coupled portion between the hole of the top side of the housing 100 and the hollow rivet 30 is sealed by the O-ring 31.

Figure 3C:
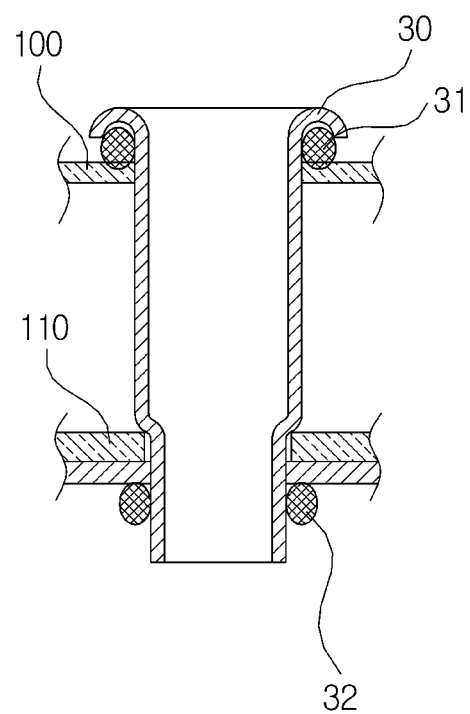

Next, as illustrated in FIG. 3C, the O-ring 32 is inserted into the end surface of the lower portion of the hollow rivet 30 protruding to the lower portion of the housing 100.

Figure 3D:
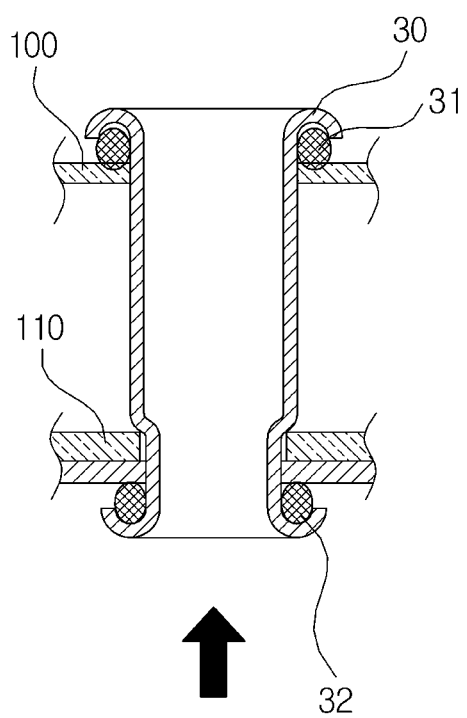
Figure 4A:
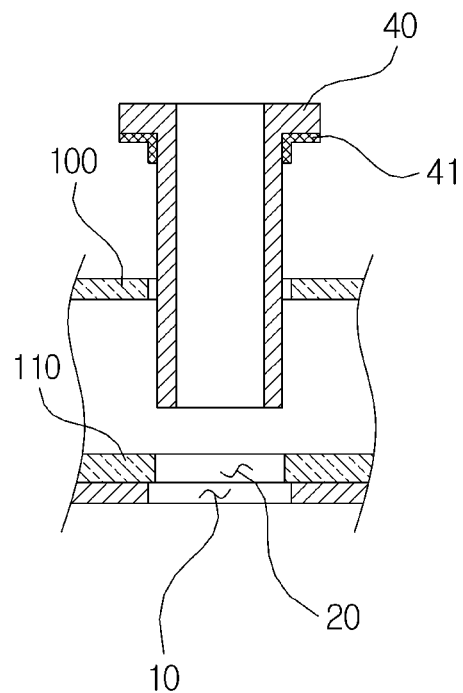
FIGS. 4A to 4D are diagrams illustrating a hollow rivet fastening process according to a second exemplary embodiment of the present disclosure.
Figure 4B:
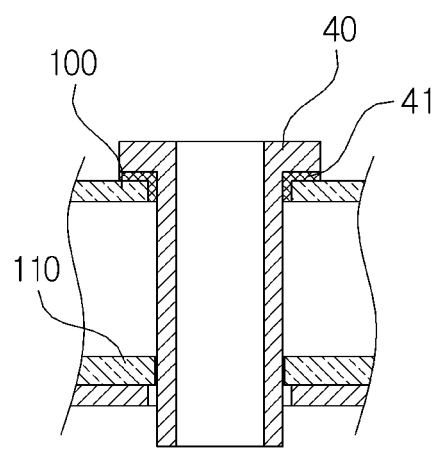
Figure 4C:
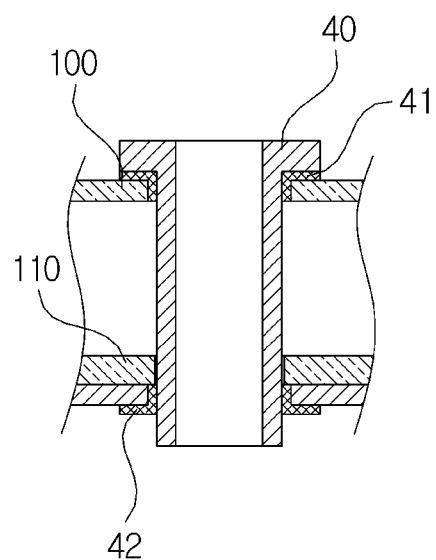
Figure 4D:
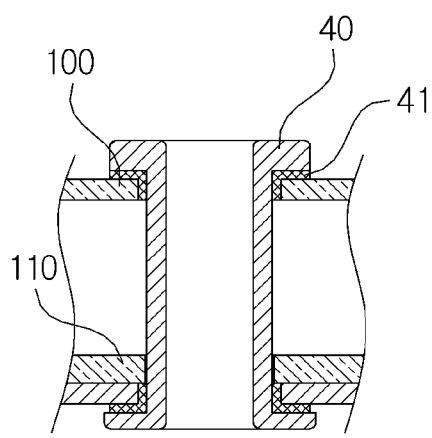

When the O-ring 32 is inserted into the end surface of the lower portion of the hollow rivet 30, as illustrated in FIG. 3D, the end surface of the lower portion of the hollow rivet 30 is physically deformed by the riveting, and the like and thus the end is bent to be enclosed outwardly. The bent end surface of the hollow rivet 30 is formed to enclose the previously inserted O-ring 32.

As described above, after the hollow rivet 30 is inserted, when the hollow rivet 30 is physically deformed by the riveting, the pressing force between the bottom surface of the housing and the PCB 110 is generated due to the physical shape of the hollow rivet 30. Therefore, the PCB 110 more firmly adheres to the housing, and thus heat generated from the PCB 110 may be smoothly conducted to the housing.

FIGS. 4A to 4D are diagrams illustrating a hollow rivet fastening process according to a second exemplary embodiment of the present disclosure.

According to the first exemplary embodiment described above with reference to FIGS. 3A to 3D, the end of the hollow rivet 30 is physically deformed in a form bent to enclose the O-rings 31 and 32, but according to the exemplary embodiment of the present disclosure, the end of a hollow rivet 40 is physically deformed to be bent in a "⌐"-letter form and O-rings 41 and 42 inserted into both ends of the hollow rivet 40 have a cross section in a " ⌐ "-letter form and thus are formed to be inserted between the housing-hole 10 and the hollow rivet 40. In this case, as illustrated in FIG. 4, the width of the housing-hole 10 is formed so that all the holes 10 formed on the top side and the bottom side of the housing, respectively, maintain the same width and the width of the hollow rivet 40 is maintained to be the same from the end of the upper portion to the end of the lower portion but is formed to be slightly smaller than the housing-hole 10. Further, a through-hole 20 formed on the PCB 110 is formed so that the hollow rivet 40 is inserted into and penetrates through the through-hole 20 while being smaller than the width of the housing-hole 10.

A gap generated after the hollow rivet 40 is inserted into the housing-hole 10 is filled through the O-rings 41 and 42.

Comparing the exemplary embodiment of the present disclosure with the foregoing first exemplary embodiment, when the hollow rivet 40 is made of a slightly harder material than the hollow rivet 30 according to the first exemplary embodiment, it is possible to prevent an immoderate force from being applied during the riveting and therefore prevent products from being damaged during the manufacturing process.

Meanwhile, the O-ring applied to the first and second exemplary embodiments is a circular ring made of a rubber or synthetic resin material or may be made of a liquid-phase silicon material having high viscosity.

Figure 5A:
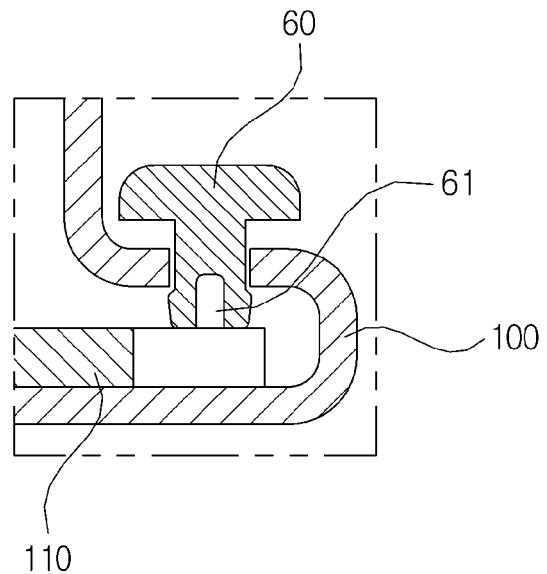
FIGS. 5A and 5B are diagrams illustrating a solid rivet fastening process according to a third exemplary embodiment of the present disclosure.
Figure 5B:
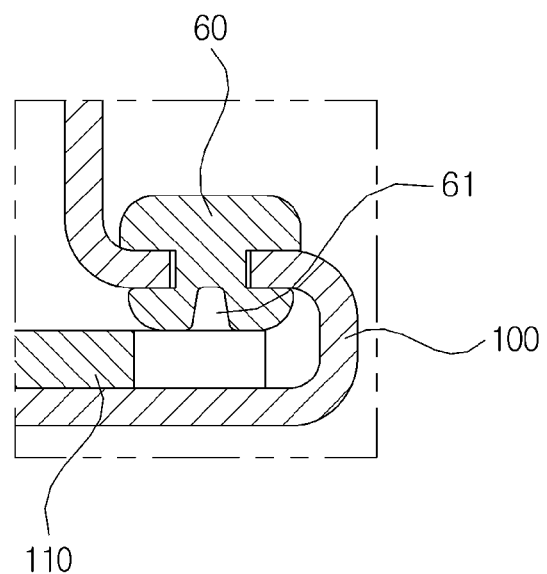

FIGS. 5A and 5B are diagrams illustrating a solid rivet fastening process according to a third exemplary embodiment of the present disclosure.

Unlike the foregoing exemplary embodiment, according to the exemplary embodiment of the present disclosure, as the coupling member, a solid rivet 60 is used.

As illustrated, only the top sides of both sides of the housing 100 according to the exemplary embodiment of the present disclosure are provided with at least one housing-hole and the corresponding bottom surfaces are not provided with the housing-hole.

The solid rivet 60 which may adhere the PCB 110 received in the housing to the housing 100 is inserted through the housing-hole at the top side of the housing.

The solid rivet 60 includes a head portion having a cross sectional area larger than the housing-hole and a body portion having a width which may penetrate through the housing-hole and a length which is larger than a height formed between the PCB 110 and the housing, a material of the head portion is rigid compare to the body portion, and an inside of the body portion is provided with a predetermined groove.

In the PCB 110, a position corresponding to the housing-hole may be provided with a protrusion 61 of the PCB 110 which protrudes toward the housing-hole and has a predetermined height and the solid rivet 60 is coupled with the groove formed on the bottom surface of the rivet and the protrusion 61 of the PCB 110 while being inserted into the housing-hole.

After the solid rivet 60 is inserted into the housing-hole, physical pressure such as the riveting is applied from the top side of the solid rivet, and thus the shape of the solid rivet 60 is deformed, such that the PCB 110 adheres to the inside of the housing 100 through the solid rivet 60.

That is, after the solid rivet 60 is inserted into the housing-hole, the physical pressure is applied from the head portion protruding to the outside of the housing and thus the shape of the body portion made of a relatively more flexible material than the head portion of the solid rivet 60 is deformed as illustrated, such that the PCB 110 adheres to the inside of the housing.

Figure 6:
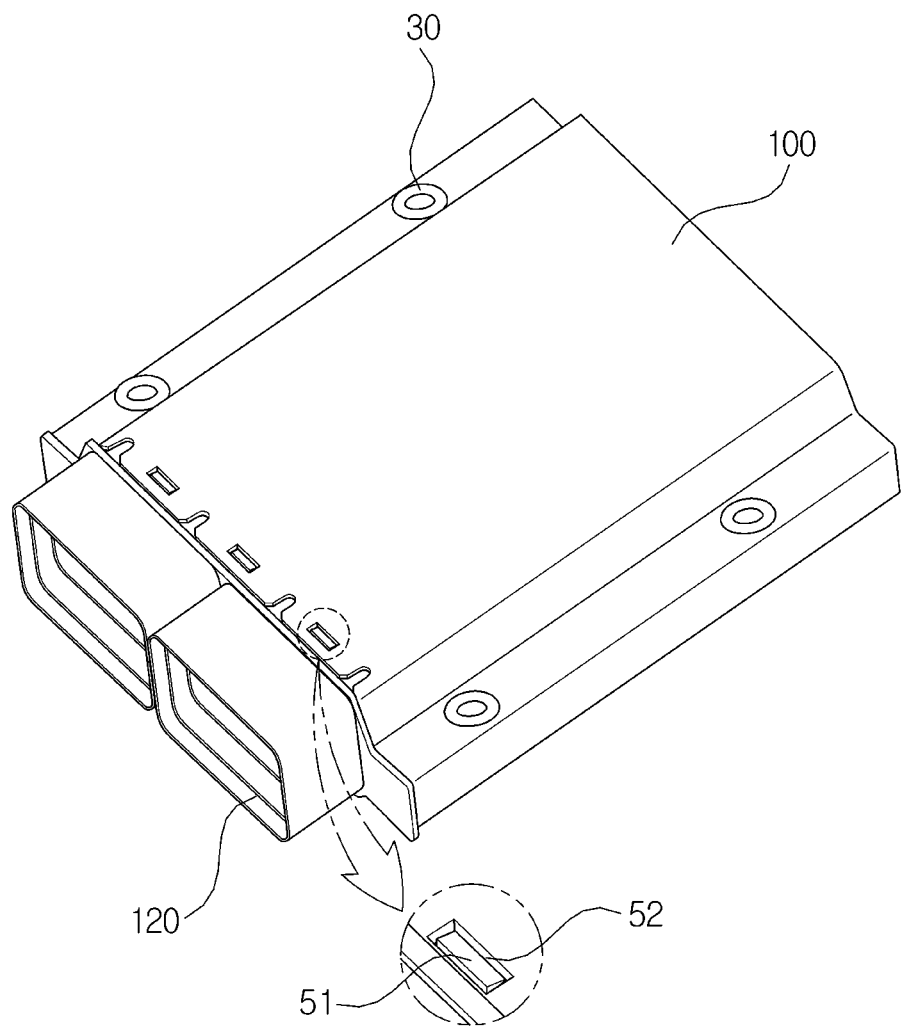
FIG. 6 is a perspective view of the electronic control apparatus coupled with the hollow rivet according to the exemplary embodiment of the present disclosure.
Figure 7:
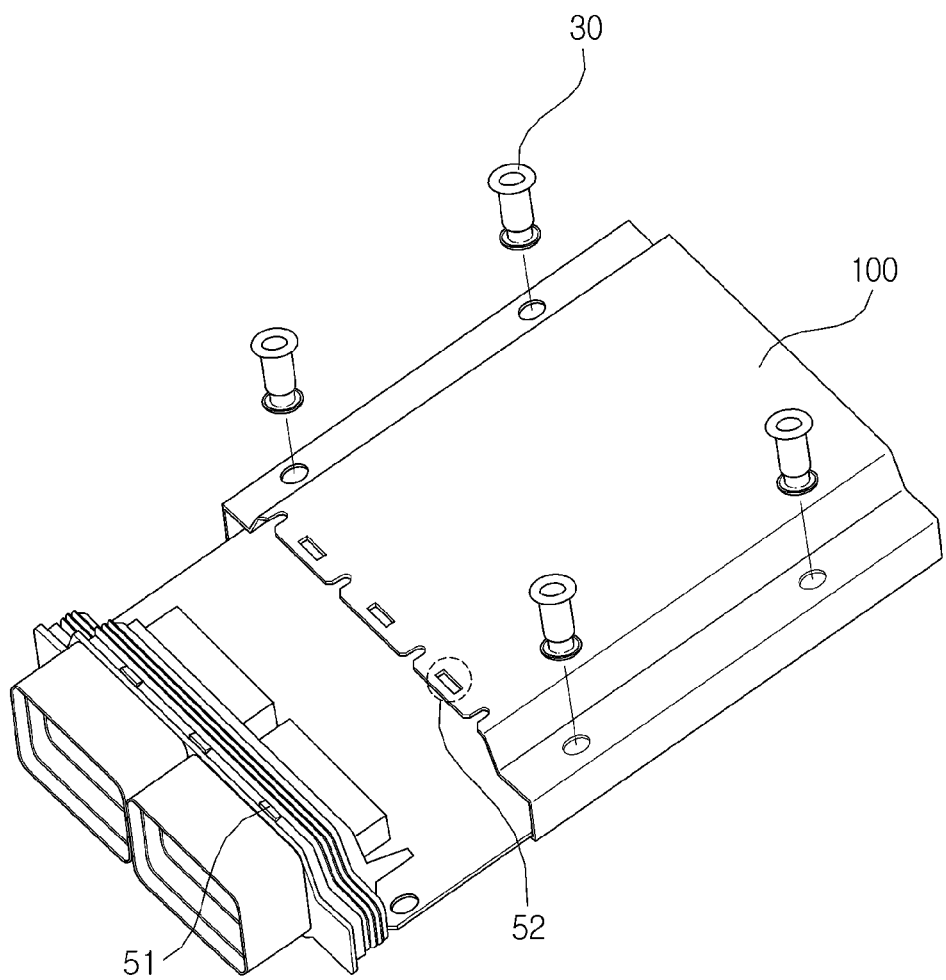
FIG. 7 is a coupling perspective view of an electronic control apparatus for a vehicle using a hollow rivet according to another exemplary embodiment of the present disclosure.

FIG. 6 is a perspective view of the electronic control apparatus for a vehicle coupled with the hollow rivet according to the exemplary embodiment of the present disclosure and FIG. 7 is a coupling perspective view of an electronic control apparatus for a vehicle using a hollow rivet.

To adhere the PCB 110 to the housing, the electronic control apparatus of the existing one-piece slot type needs to use a bolt, a nut, or other clamping parts at the inside or the outside of the housing during the assembling process, and as a result, in the case of using the fastening means, the assembling time and process may be increased.

However, as illustrated in FIGS. 6 and 7, when the electronic control apparatus of the one-piece slot type uses the hollow rivet according to the exemplary embodiment of the present disclosure, the PCB 110 may be fixed to the housing by a much simpler process than the related art and the assembling time may be shortened. Further, since the PCB 110 may adhere to the housing 100 using the hollow rivet 30, the heat generated from the PCB 110 may be smoothly emitted to the outside through the housing.

Meanwhile, when the PCB 110 is inserted and coupled with the housing 100, as illustrated in FIG. 6, the coupling part of the connector cover 120 is provided with a protrusion 51 and a corresponding surface of the housing contacting the coupling part is provided with a groove 52 to fasten the protrusion 51 of the coupling part with the groove 52 of the housing when the connector cover 120 is coupled with the housing, thereby forming a more firmly coupled structure.

As described above, the exemplary embodiments have been described and illustrated in the drawings and the specification. The exemplary embodiments were chosen and described in order to explain certain principles of the disclosure and their practical application, to thereby enable others skilled in the art to make and utilize various exemplary embodiments of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the disclosure are deemed to be covered by the disclosure which is limited only by the claims which follow.

What is claimed is:

1. An electronic control apparatus for a vehicle, comprising:
    a printed circuit board (PCB), the PCB electrically controlling each part of the vehicle and having at least one through-hole in a side;
    a connector cover comprising a connector part electrically connected and coupled with the PCB and a coupling part;
    a housing, the housing receiving the PCB inserted in a slide form and the housing comprising at least one housing-hole; and
    a hollow rivet, the hollow rivet fixing the PCB to the housing through the through-hole of the PCB and the housing-hole of the housing,
    wherein the hollow rivet is inserted into the housing-hole through which the PCB is inserted into the housing and one end surface of the hollow rivet is physically deformed, such that the PCB adheres to an inside of the housing,
    wherein the housing-hole is formed so that a hole formed on a top side of the housing has a cross sectional area wider than a cross sectional area of a hole formed on a bottom side of the housing, and
    the hollow rivet penetrating through the housing-hole has an upper width which is wider than a lower width so as to correspond to the housing-hole.

2. The apparatus of claim 1, wherein both ends of the hollow rivet are inserted with O-rings and a gap of a coupled portion between the housing and the hollow rivet is sealed by the O-rings.

3. The apparatus of claim 2, wherein after the hollow rivet is inserted into the housing-hole, one end surface of the hollow rivet protruding to an outside of the housing is inserted with the O-ring and one end surface of the protruding hollow rivet is physically deformed so as to generate a pressing force to the PCB, such that the PCB adheres to the inside of the housing.

4. The apparatus for a vehicle of claim 2, wherein the O-ring is a circular ring made of a rubber or synthetic resin material.

5. The apparatus for a vehicle of claim 2, wherein the O-ring is made of a liquid-phase silicon material having high viscosity.

6. The apparatus for a vehicle of claim 1, wherein a cross sectional area of the through-hole formed on the PCB is smaller than the cross sectional area of the housing-hole formed on the top side of the housing and is larger than the cross sectional area of the housing-hole formed on the bottom side of the housing, and
    the hollow rivet maintains the same width so as to penetrate through the housing-hole formed on the top side of the housing up to a predetermined height from the top side of the housing-hole to a position near the bottom side thereof and has a narrow width so as to penetrate through the through-hole formed on the PCB and the housing-hole formed on the bottom side of the housing.

7. The apparatus of claim 1, wherein the coupling part of the connector cover is provided with a protrusion and a corresponding surface of the housing contacting the coupling part is provided with a groove to fasten the protrusion of the coupling part with the groove of the housing when the connector cover is coupled with the housing.

8. An electronic control apparatus for a vehicle, comprising:
    a printed circuit board (PCB), the PCB electrically controlling each part of the vehicle;
    a connector cover comprising a connector part electrically connected and coupled with the PCB and a coupling part;
    a housing, the housing receiving the PCB inserted in a slide form and having at least one housing-hole on surfaces of both sides; and
    a solid rivet, the solid rivet fixing the PCB to the housing through the housing-hole of the housing,
    wherein after the solid rivet is inserted into the housing-hole, a physical pressure is applied from the top side of the solid rivet for deformation of a shape of the solid rivet, such that the PCB adheres to the inside of the housing through the solid rivet,
    wherein the PCB comprises a protrusion which protrudes toward the housing-hole and has a predetermined height, and the solid rivet has a groove into which the protrusion of the PCB is inserted.

9. The apparatus of claim 8, wherein the solid rivet includes a head portion having a cross sectional area larger than the housing-hole and a body portion having a width which penetrates through the housing-hole and a length which is larger than a height formed between the PCB and the housing, and a material of the head portion is rigid compare to the body portion, an inside of the body portion is provided with the groove to couple the solid rivet with the protrusion of the PCB through the housing-hole, and after the solid rivet is inserted into the housing-hole, a physical pressure is applied from the head portion protruding to the outside of the housing for deformation of a shape of the body portion of the solid rivet, such that the PCB adheres to the inside of the housing.

10. A method for manufacturing an electronic control apparatus for a vehicle comprising a printed circuit board (PCB), a connector, and a housing and has the PCB and the housing provided with a housing-hole, the method comprising:

coupling the PCB electrically controlling each part of the vehicle with a connector;

inserting the PCB into the housing in a slide form;

inserting a hollow rivet by having one end surface inserted with an O-ring into the housing-hole of the housing into which the PCB is inserted;

inserting and coupling the O-ring into a longitudinal cross section of the hollow rivet protruding to an outside of the housing-hole; and fixing the PCB to the inside of the housing by physically deforming a longitudinal cross section of the hollow rivet into which the O-ring is inserted, wherein the housing-hole is formed so that a housing-hole formed on a top side of the housing has a cross sectional area wider than a cross sectional area of a housing-hole formed on a bottom side of the housing, and the hollow rivet penetrating through the housing-hole has an upper width which is wider than a lower width so as to correspond to the housing-hole.

11. The method of claim 10, wherein the O-ring inserted into the hollow rivet is a circular ring made of a rubber or synthetic resin material and a gap of a coupled portion between the housing and the hollow rivet is sealed by the O-ring.

12. The method of claim 10, wherein the O-ring is made of a liquid-phase silicon material having high viscosity and a gap of a coupled portion between the housing and the hollow rivet is sealed by the O-ring.

13. The method of claim 10, wherein a cross sectional area of the housing-hole formed on the PCB is smaller than the cross sectional area of the housing-hole formed on the top side of the housing and is larger than the cross sectional area of the hole formed on the bottom side of the housing, and the hollow rivet maintains the same width so as to penetrate through the hole formed on the top side of the housing up to a height from the top side of the housing-hole to a position near the bottom side thereof and has a narrow width so as to penetrate through the housing-hole formed on the PCB and the housing-hole formed on the bottom side of the housing.

* * * * *